United States Patent
McKinley

(10) Patent No.: US 6,729,834 B1
(45) Date of Patent: May 4, 2004

(54) WAFER MANIPULATING AND CENTERING APPARATUS

(75) Inventor: Steve McKinley, Mesa, AZ (US)

(73) Assignee: BTU International, Inc., N. Billerica, MA (US)

( * ) Notice: Subject to any disclaimer, the term of this patent is extended or adjusted under 35 U.S.C. 154(b) by 0 days.

(21) Appl. No.: 09/722,932

(22) Filed: Nov. 27, 2000

(51) Int. Cl.⁷ .................................................. B25J 1/00
(52) U.S. Cl. .............. 414/754; 414/222.01; 414/226.05
(58) Field of Search ............................ 414/754, 222.01, 414/226.05

(56) References Cited

U.S. PATENT DOCUMENTS

| | | | | |
|---|---|---|---|---|
| 5,238,354 A | * | 8/1993 | Volovich | 414/779 |
| 5,474,410 A | * | 12/1995 | Ozawa et al. | 414/217 |
| 5,781,523 A | * | 7/1998 | Ozawa et al. | 369/77.1 |
| 5,784,344 A | * | 7/1998 | Ahn | 369/36 |
| 5,788,453 A | * | 8/1998 | Donde et al. | 414/751 |
| 6,126,380 A | * | 10/2000 | Hillman | 414/744.6 |
| 6,126,381 A | * | 10/2000 | Bacchi et al. | 414/754 |
| 6,126,382 A | * | 10/2000 | Scales et al. | 414/754 |
| 6,298,280 B1 | * | 10/2001 | Bonora et al. | 700/218 |
| 6,318,948 B1 | * | 11/2001 | Ueda et al. | 414/416.08 |

FOREIGN PATENT DOCUMENTS

JP  408195376 A  *  1/1995  ....... H01L/21/3065

* cited by examiner

Primary Examiner—Eileen D. Lillis
Assistant Examiner—Michael Lowe
(74) Attorney, Agent, or Firm—Weingarten, Schurgin, Gagnebin & Lebovici LLP

(57) ABSTRACT

Apparatus for manipulating wafers comprising a fixture including seats each for receiving and supporting a wafer in a seated condition and an element mounted for reciprocal movement in opposition to the fixture between a retracted condition and an extended condition into an opening of the fixture for engaging a wafer held by the fixture in the seated condition.

1 Claim, 4 Drawing Sheets

WAFER MANIPULATING AND CENTERING APPARATUS

FIELD OF THE INVENTION

This invention relates to apparatus and methods for manipulating and centering wafers or wafer-like objects and for centering and placing wafers or wafer-like objects upon machine parts.

BACKGROUND OF THE INVENTION

Many manufacturing processes involve the manipulation and processing of wafer such as discs or wafer-like objects constructed of metal or metallic composites, carbon, plastic, wood, artificial and/or natural substrates, etc. In order to properly process, machine or act upon wafers, it is often important to center them in relation to a machine part. Most centering devices are very expensive and exceedingly difficult to construct. Because many businesses either cannot afford or desire to afford expensive centering equipment, the need for certain new and useful improvements in the art is evident.

Accordingly, it would be highly desirable to provide new and improved apparatus and methods for centering and placing wafers upon a machine part.

It is a purpose of the invention to provide new and improved apparatus that are easy to construct and inexpensive.

It is another purpose of the invention to provide new and improved apparatus that may be employed across a wide spectrum of technical disciplines.

It is still another purpose of the invention to provide an easy, inexpensive and highly accurate method of centering wafers in relation to a machine part.

It is a further provision of the invention to decrease the high costs normally associated with manufacturing, processing and machining wafers.

SUMMARY OF THE INVENTION

The above problems and others are at least partially solved and the above purposes and others realized in new and improved apparatus and methods for centering and placing wafers upon a machine part. In a preferred embodiment, the invention provides apparatus for manipulating wafers comprising a fixture including terraced, concentrically arranged seats having diameters centered about a common axis extending through an opening of the fixture. The diameters of the seats are different from one another. Each seat is capable of receiving and supporting in a seated condition a wafer having a diameter that is centered substantially about a central axis, the diameter of the wafer being substantially equal to the diameter of the given seat. An element is mounted for reciprocal movement in opposition to the fixture along an element axis between a retracted condition and an extended condition into the opening for engaging a wafer held by the fixture in the seated condition and removing the wafer from the fixture. The central axis of a wafer when held by the fixture in the seated condition, the common axis and the element axis are substantially coincident. Each seat is substantially continuous, and the diameter of each seat is defined by one of a plurality of substantially continuous sidewalls of the fixture. In a particular embodiment, the fixture is supported and movable by a framework between first and second positions for rendering substantially coincident the fixture and element axes. A gap severs the fixture, which allows the element to pass through the fixture for permitting movement of the fixture between the first and second positions. The gap communicates with the opening.

Consistent with the foregoing, associated methods may also be provided.

BRIEF DESCRIPTION OF THE DRAWINGS

The foregoing and further and more specific objects and advantages of the invention will become readily apparent to those skilled in the art from the following detailed description taken in conjunction with the drawings in which.

DETAILED DESCRIPTION OF A PREFERRED EMBODIMENT

Figure 1:
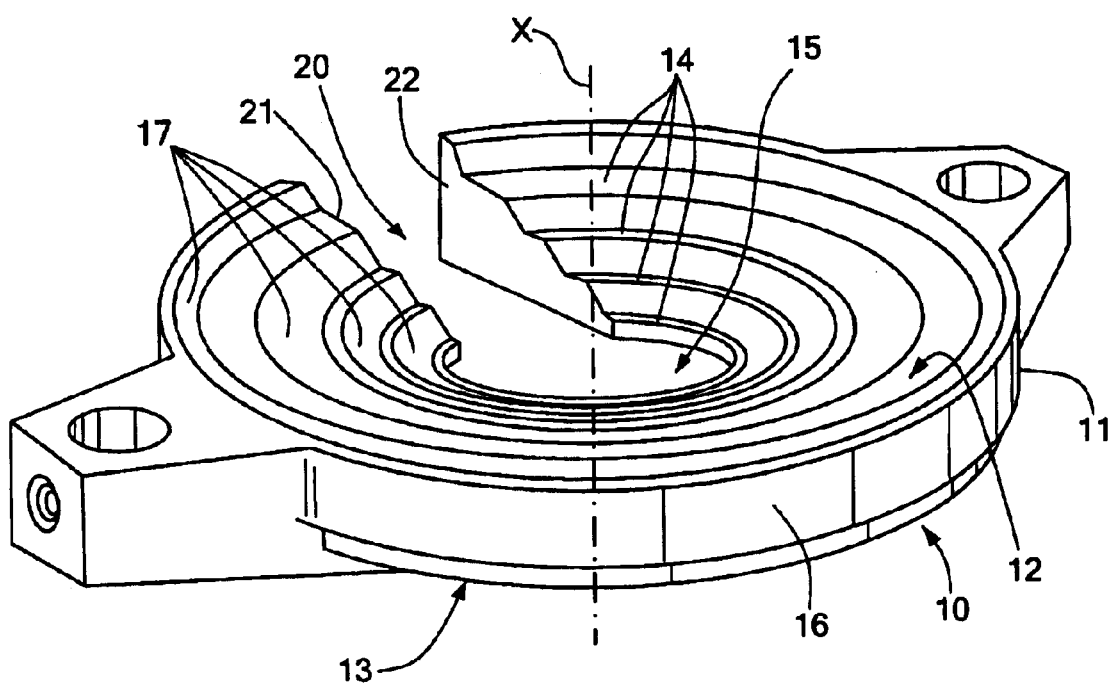
FIG. 1 is a perspective view of a fixture for supporting wafers.

Turning to the drawings, in which like reference characters indicate corresponding elements throughout the several views, attention is first directed to FIG. 1, which illustrates a perspective view of a fixture 10 for supporting wafers. Fixture 10 is constructed of machined or molded aluminum, steel, plastic or other suitable material, and is comprised of a body 11 having opposing major faces 12 and 13. Body 11 is rugged and stout and substantially annular or disk-like in shape. Face 12 is substantially concave or depressed and defines terraced, concentrically arranged seats 14 that have or otherwise define diameters centered substantially about a common axis X extending through a central opening 15 of fixture 10. Although only four seats 14 are shown, fixture 10 may be constructed with less or more than four. The seat 14 closest to opening 15 has the smallest diameter of all the seats 14. The diameters of seats 14 progressively increase from opening 15 to the outer or distal extremity 16 of fixture 10, and each seat 14 is substantially continuous and resides along a different horizontal plane. The diameter of each seat 14 is defined by one of a plurality of substantially continuous sidewalls 17 that mark, at least in part, the terraced condition of face 12. Sidewalls 17 face axis X. A gap 20 severs fixture 10 forming opposing free ends 21 and 22. Gap 20 has a predetermined width, extends from outer extremity 16 to opening 15 and communicates with opening 15.

Figure 2:
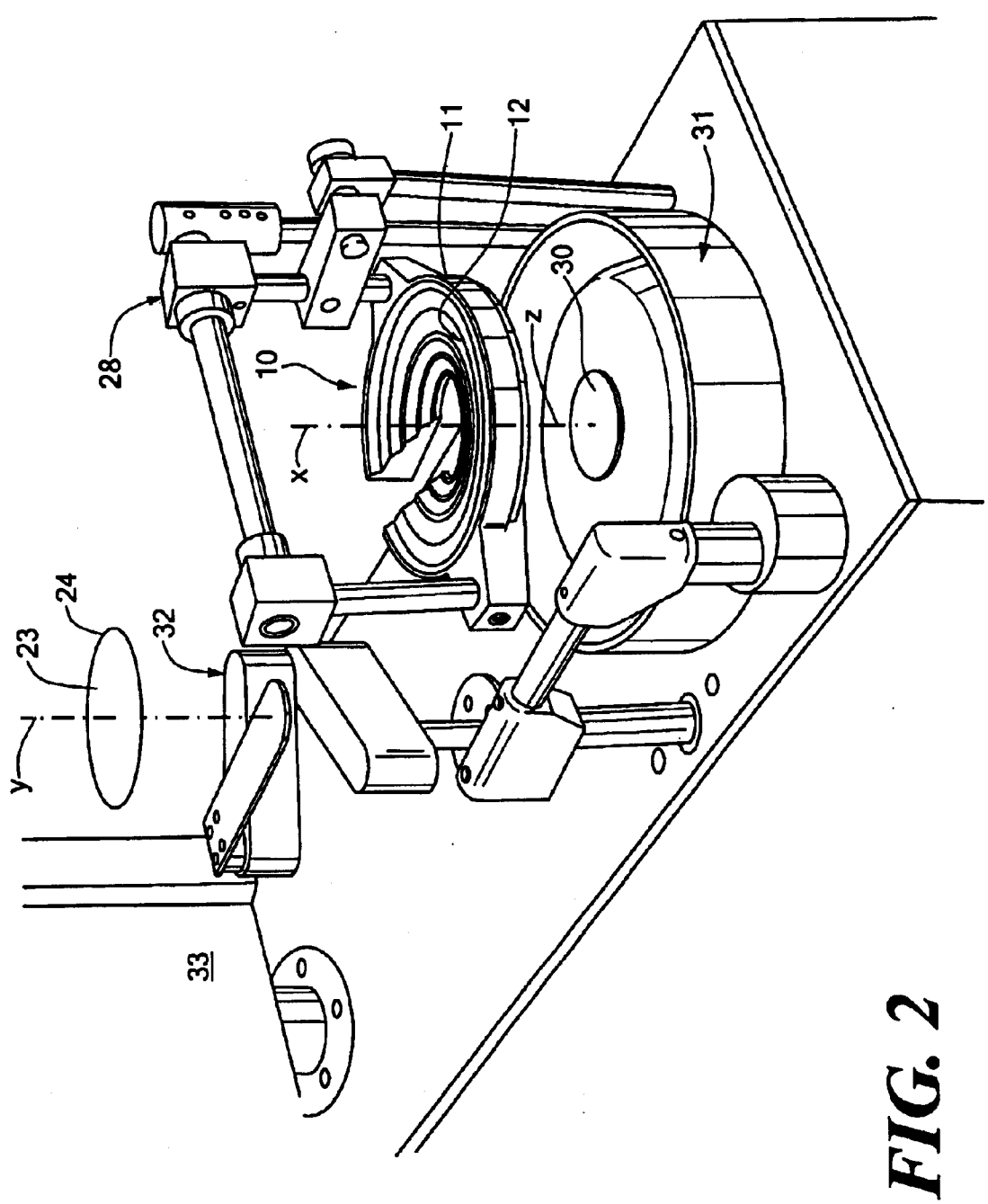
FIG. 2 is apparatus for manipulating the fixture of FIG. 1 for centering and placing wafers upon a reciprocally movable element.

The function of each seat 14 is to support in a seated condition a wafer having a diameter substantially equal to that of the given seat 14, which ensures that the central axis of the wafer is substantially coincident with axis X. In terms of this disclosure, the term wafer is intended to denote a flat or relatively flat disk-like element having an outer diameter centered substantially about a central axis defined at the central midpoint thereof. The diameter of the wafer is defined by an outer or distal extremity, which may be continuous or substantially continuous. The wafer may be circular, substantially circular, oval, square, triangular, rectangular, trapezoidal, octagonal, etc. Consistent with this definition of the term wafer, FIG. 2 illustrates a wafer 23 having an outer diameter defined by an outer extremity 24 thereof which is centered substantially about a central axis Y defined at a central midpoint thereof. Although each seat 14 is shown having a circular or substantially circular footprint, each seat 14 may be formed having a substantially oval, square, triangular, rectangular, trapezoidal, octagonal or other suitably shaped footprint for accommodate a correspondingly shaped wafer. Each seat 14 is further capable of supporting a wafer at or adjacent the outer extremity of the wafer, leaving the central axis of the wafer adjacent opening 15 and substantially coincident with axis X of fixture 10.

In FIG. 2, shown is an element 30 mounted for reciprocal movement along an axis Z between a retracted condition as shown and an extended condition. Element 30 is considered at least part of or otherwise associated with any of a variety of manually operable or automated apparatus 31 designed to act upon, process and/or machine wafers. In FIG. 2, fixture 10 is carried by a framework 28 and is positioned in what is considered an operative position opposite and somewhat spaced from element 30, with axis X being substantially coincident with axis Z and face facing away from element 30. This is the intended positioning of fixture 10, which allows it to function as a device for centering wafers in relation to element 30 and, more particularly, for rendering substantially coincident the central axis of a wafer held by fixture 10 in a seated condition with axis Z.

Opening 15 of fixture 10 is of a size sufficient for allowing element 30 to pass therethrough in the extended condition thereof when fixture 10 is in its operative position. In the operative position, wafer 23 may be placed upon one of seats 14 of fixture 12 in the seated condition. In the seated condition, wafer 23 is held by the one of seats 14 having a diameter substantially equal to the diameter of wafer 23 which renders substantially coincident axes X, Y and Z. So held and centered in relation to element 30, element 30 may be moved, either automatically or manually, from its retracted condition to its extended condition into and through opening 15 for engaging wafer 23 held by fixture 10 in the seated condition and removing wafer 23 from fixture 10.

Figure 3:
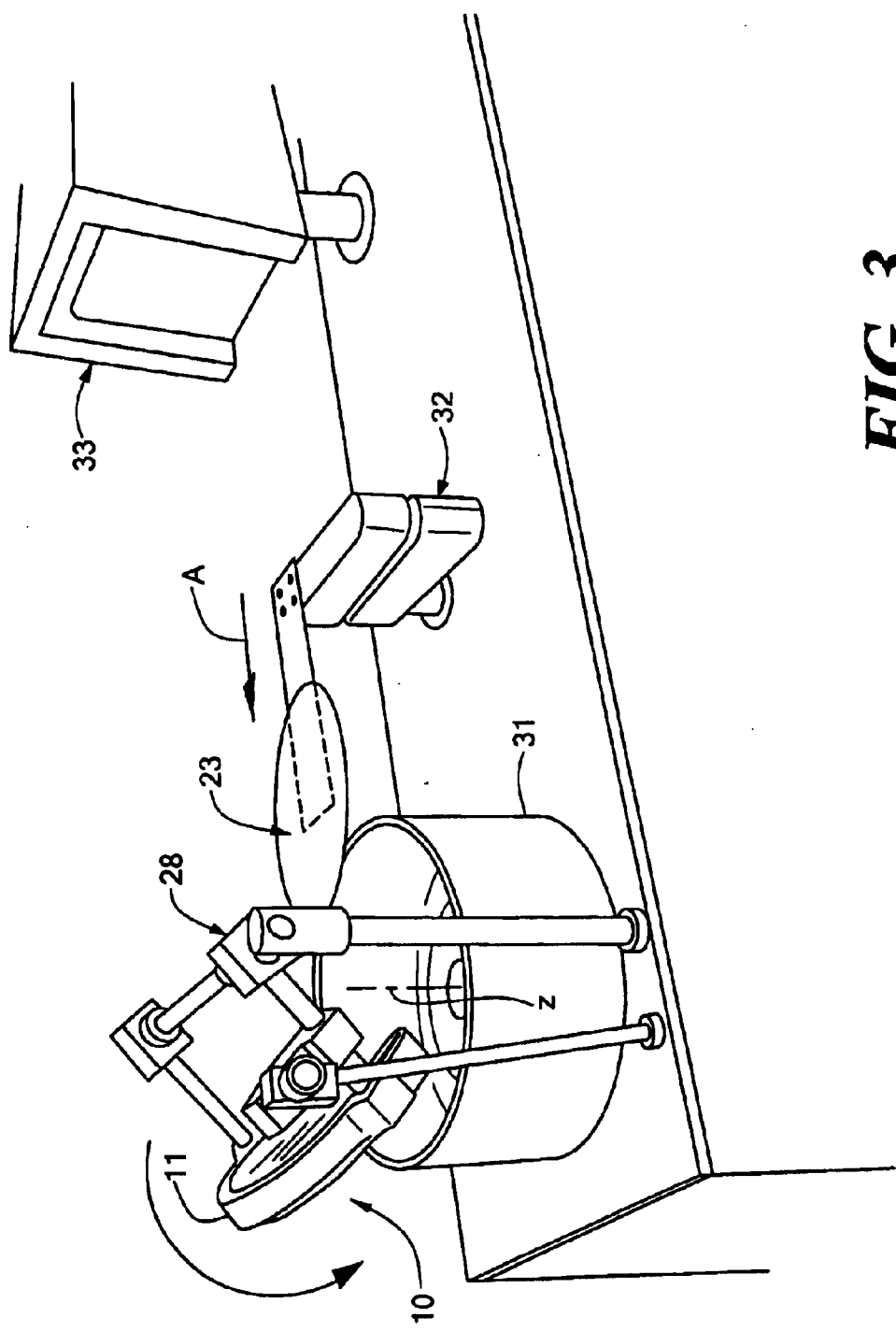
FIGS. 3 and 4 illustrate the apparatus of FIG. 1 as it would appear centering and placing a wafer upon the reciprocally movable element.
Figure 4:
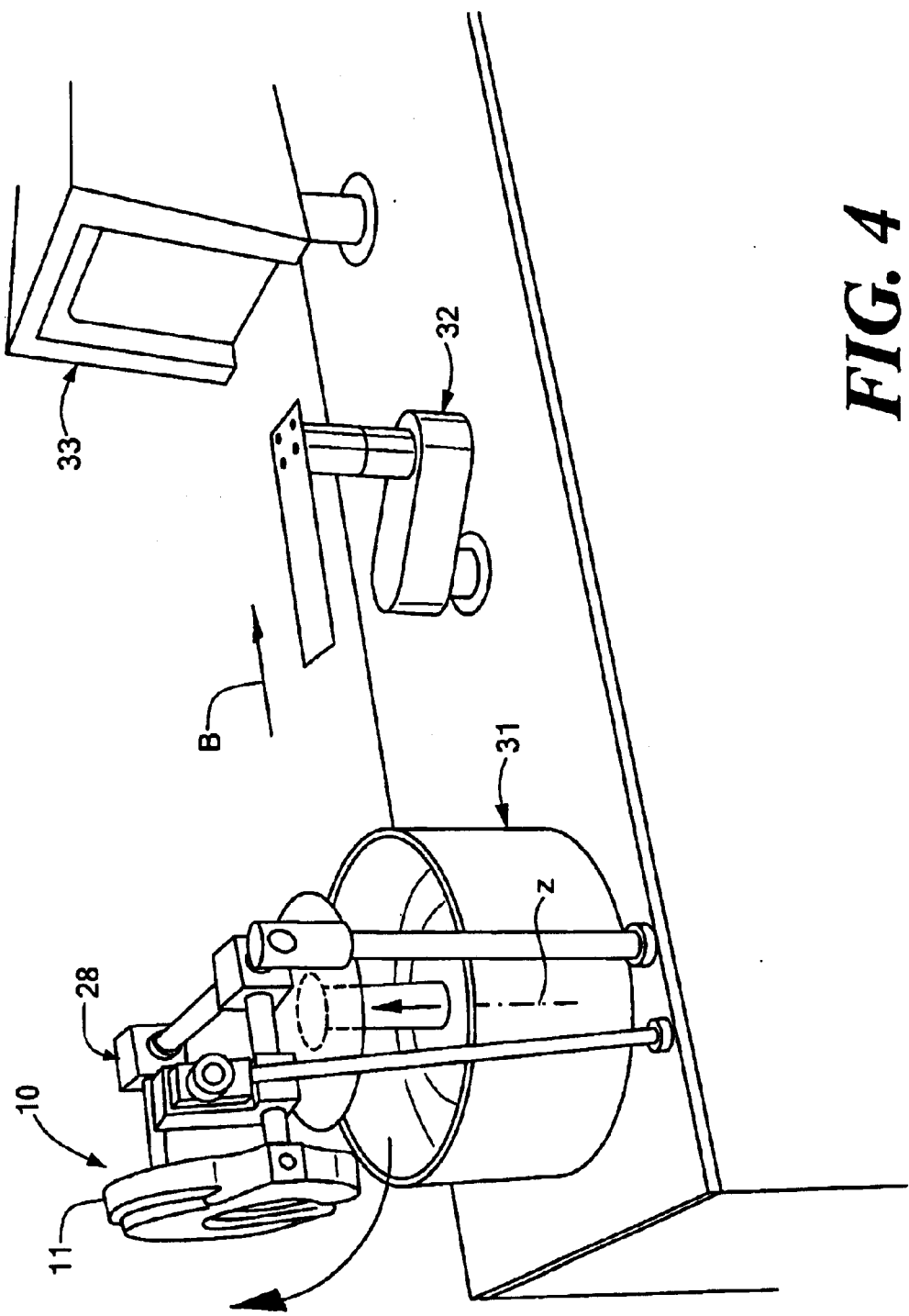

Wafer 23 may be delivered to fixture 10 by hand or with the aid of an automatically or manually maneuverable mechanical arm 32. Arm 32 may be coupled to and actuated by a computer 33. Furthermore, framework 28 may be arranged and designed to be movable by hand or with the aid of an automatic or manually maneuverable device between first and second positions for moving fixture 10 between a position away from element 30 and its operative position. Like arm 32, framework 28 may be coupled to and actuated by computer 33. FIGS. 3 and 4 show the sequence of operation of centering wafer 23 upon element 30. In FIG. 3, framework 28 is shown as it would appear moving fixture 10 into its operative position for allowing arm 32 to present wafer 23 upon fixture 10 in the direction generally denoted by the arrowed line A. After placing wafer 23 upon fixture 10, arm 32 is moved away in the direction generally denoted by the arrowed line B in FIG. 4. With wafer 23 properly in its seated condition, element 30 may be moved into its extended condition into and through opening 15 for engaging and removing wafer 23 from fixture 10. FIG. 4 shows element 30 as it would appear in its extended condition with wafer 23 as it would appear removed from fixture 10 and carried by element 30. At this stage, framework 28 may be actuated for moving fixture 10 away from element 30 and wafer 23 for allowing other devices to act upon wafer 23 without obstruction from fixture 12. Gap 20 is of a size sufficient to allow element 30 to pass therethrough. As a result, framework 28 may be configured to swing fixture 10 away from its operative position in a manner sufficient for permitting gap 20 to accommodate and allow element 30 to pass therethrough.

The invention has been described above with reference to one or more preferred embodiments. However, those skilled in the art will recognize that changes and modifications may be made in the described embodiments without departing from the nature and scope of the invention. For instance, although seats 14 are each substantially continuous, seats 14 may each be comprised of a plurality of supporting elements located along a substantially common horizontal plane and positioned apart from one another at spaced intervals. Various changes and modifications to one or more of the embodiments herein chosen for purposes of illustration will readily occur to those skilled in the art. To the extent that such modifications and variations do not depart from the spirit of the invention, they are intended to be included within the scope thereof, which is assessed only by a fair interpretation of the following claims.

Having fully described the invention in such clear and concise terms as to enable those skilled in the art to understand and practice the same, the invention claimed is:

1. A method for centering a wafer in relation to and placing the wafer upon an element mounted for reciprocal movement along an element axis, the wafer including a diameter centered about a central axis, the method comprising the steps of:

provideing a fixture including a plurality of terraced, concentrically arranged seats having respective diameters centered about a common axis extending through an opening of the fixture, the diameters of the seats being different from one another, the fixture having a gap formed therethrough extending from the opening through a periphery of the fixture;

mounting the fixture in a first position adjacent the element such that the fixture axis is substantially coincident with the element axis;

positioning the wafer upon one of the seats for supporting the wafer in opposition to the element and for rendering substantially coincident the fixture, element and central axes;

moving the element into the opening, thereby engaging and removing the wafer from the fixture, and moving the fixture from the first position to a second position adjacent the element such that the fixture axis is substantially perpendicular to the element axis, thereby allowing the element to pass through the gap.

* * * * *

UNITED STATES PATENT AND TRADEMARK OFFICE
CERTIFICATE OF CORRECTION

PATENT NO. : 6,729,834 B1
DATED : May 4, 2004
INVENTOR(S) : Steve McKinley

It is certified that error appears in the above-identified patent and that said Letters Patent is hereby corrected as shown below:

Column 3,
Line 18, "face facing" should read -- face 12 facing --; and
Line 28, "fixture 12" should read -- fixture 10 --.

Signed and Sealed this

Twenty-first Day of June, 2005

JON W. DUDAS
*Director of the United States Patent and Trademark Office*